United States Patent

Wan

[11] Patent Number: 5,978,489
[45] Date of Patent: Nov. 2, 1999

[54] MULTI-ACTUATOR SYSTEM FOR ACTIVE SOUND AND VIBRATION CANCELLATION

[75] Inventor: Eric Andrew Wan, Hillsboro, Oreg.

[73] Assignee: Oregon Graduate Institute of Science and Technology, Beaverton, Oreg.

[21] Appl. No.: 09/072,416

[22] Filed: May 4, 1998

Related U.S. Application Data

[60] Provisional application No. 60/045,881, May 5, 1997.

[51] Int. Cl.[6] .............................. H03B 29/00; A61F 11/06
[52] U.S. Cl. ..................................... 381/71.11; 381/71.12; 708/322
[58] Field of Search ................................ 381/71.11, 71.1, 381/71.5, 71.8, 71.9, 71.12, 71.14, 94.1–94.9, 72, 96, FOR 123, FOR 124; 708/322

[56] References Cited

U.S. PATENT DOCUMENTS

| | | | |
|---|---|---|---|
| 4,658,426 | 4/1987 | Chbries et al. | 381/71.11 |
| 4,677,676 | 6/1987 | Eriksson | 381/71.11 |
| 4,677,677 | 6/1987 | Eriksson | 381/71.11 |
| 4,837,834 | 6/1989 | Allie | 381/71.11 |
| 5,216,721 | 6/1993 | Melton | 381/71.12 |
| 5,216,722 | 6/1993 | Popovich | 381/71.12 |
| 5,577,127 | 11/1996 | Van Overbeek | 381/71.11 |
| 5,590,205 | 12/1996 | Popovich | 381/71.11 |
| 5,602,929 | 2/1997 | Popovich | 381/71.11 |
| 5,633,795 | 5/1997 | Popovich | 381/71.11 |
| 5,687,075 | 11/1997 | Stothers | 381/94.1 |
| 5,691,893 | 11/1997 | Stothers | 381/71.11 |
| 5,701,350 | 12/1997 | Popovich | 381/71.11 |
| 5,715,320 | 2/1998 | Allie et al. | 381/71.11 |
| 5,768,124 | 6/1998 | Stothers et al. | 381/71.1 |

FOREIGN PATENT DOCUMENTS

| | | | |
|---|---|---|---|
| 6-230787 | 8/1994 | Japan | 381/FOR 124 |
| 6-25674 | 9/1994 | Japan | 381/FOR 124 |
| 6-314097 | 11/1994 | Japan | 381/FOR 124 |

OTHER PUBLICATIONS

Elliott, et al., "Active Noise Control," *IEEE Signal Processing Magazine*, pp. 12–36 (Oct. 1993).

*Primary Examiner*—Forester W. Isen
*Assistant Examiner*—Xu Mei
*Attorney, Agent, or Firm*—Jerry G. Wright; Flehr Hohbach Test Albritton & Herbert LLP

[57] ABSTRACT

A multi-actuator system for active sound and vibration cancellation utilizes an LMS type algorithm having an adaptive filter. However, the error signal rather than the input is filtered through an adjoint filter of the error channel to drive an adaptive filter which in turn drives, for example, a loudspeaker to provide destructive interference for noise cancellation. The adjoint filter is realized by converting a standard filter's flow direction, such as a finite impulse response filter, swapping branching points with summing junctions and unit delays with unit advances. For multiple-input-output systems, computational complexity is significantly reduced.

4 Claims, 5 Drawing Sheets

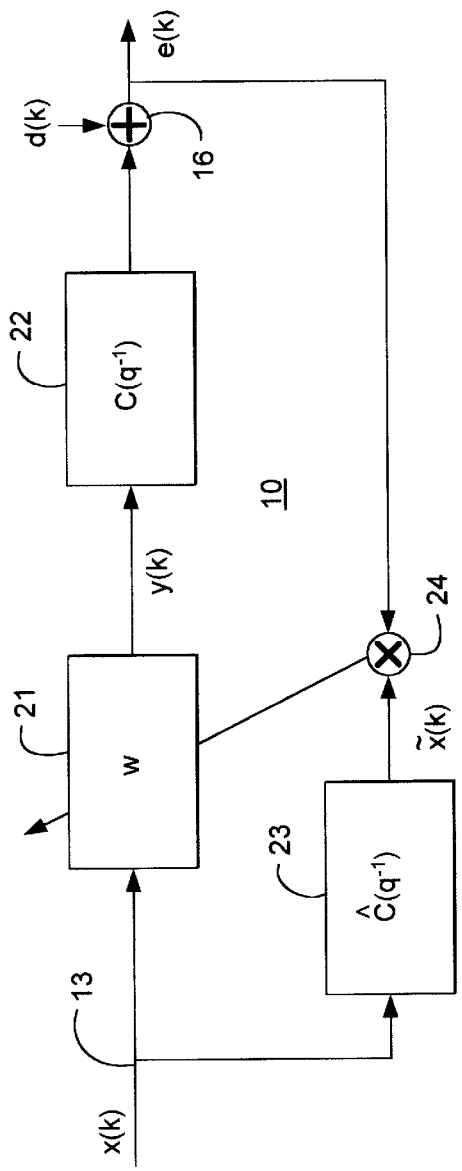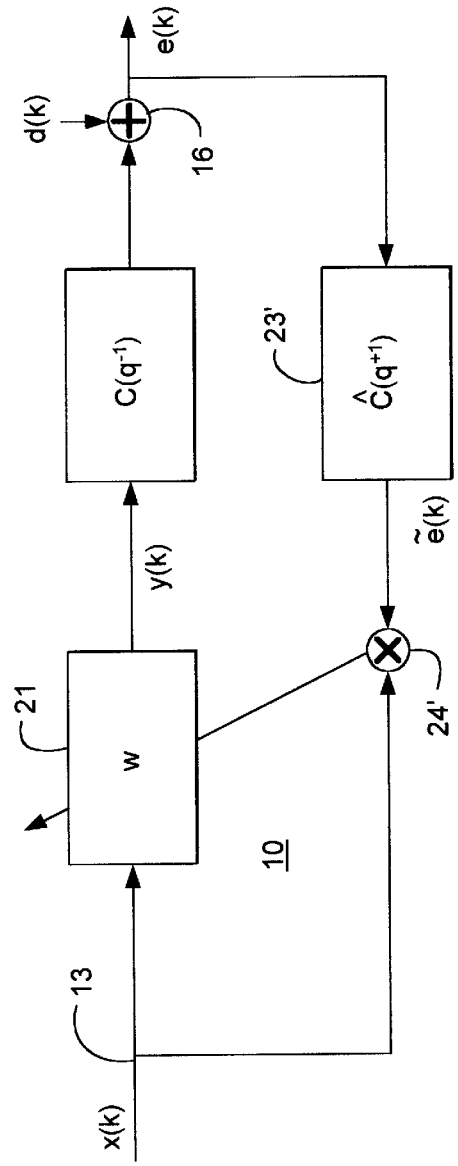

MULTI-ACTUATOR SYSTEM FOR ACTIVE SOUND AND VIBRATION CANCELLATION

This is a Continuation-in-Part of Provisional Application 60/045,881 filed May 5, 1997.

The present invention is directed to a multi-actuator system for active sound and vibration cancellation and more specifically to a system where multiple inputs and outputs can be accommodated with minimum computational complexity.

BACKGROUND OF THE INVENTION

Active noise control systems using the well-known filtered-x LMS (least mean square) Algorithm are known for electrical noise cancellation. A general discussion is by S. Elliot and P. Nelson, Active Noise Control, *IEEE Signal Processing Magazine*, October 1993. The well-known filtered-x LMS Algorithm is discussed by B. Widrow and S. Stearns in a book, *Adaptive Signal Processing*, Prentice Hall, 1985. The above algorithm uses an adaptive filter in conjunction with a transfer function in the forward path which filters the input. The Filtered-x LMS algorithm is most ideally used in a single-input single-output (SISO) system. For multiple-input multiple-output (MIMO) systems, the Multiple Error LMS algorithm is a generalization of the Filtered-x LMS algorithm.

For the SISO system, the computational complexity is of a desirable order N, where N is the number adjustable parameters of the adaptive filter. However, in the multiple error LMS algorithm the desirable order N computational complexity of LMS is lost, resulting in prohibitive cost.

OBJECT AND SUMMARY OF THE INVENTION

It is therefore general object of the present invention to provide an improved multi-actuator system for active sound and vibration cancellation.

In accordance with the above object there is provided a multiple input/output system for active sound/vibration cancellation in a desired area of a physical environment having one or more sources of sound and/or vibration comprising a primary transducer(s) means for picking up said sound and/or vibration and converting to electrical signals representative of said sources. Controlled transducer/actuator means located in said physical environment near said area of cancellation provide cancellation by destructive interference with the one or more source. Secondary transducer means located in the area of cancellation for pick up via a secondary physical channel both the sources of sound and/or vibration and the destructive interference, the secondary physical channel having parameters determined by the physical environment. The secondary transducer means include set point means related to the cancellation to provide an error signal. Adaptive filter means are driven by the electrical signals representative of the source for driving the controlled transducer/actuator means. Adjoint filter means modelled after the secondary physical channel receive the error signals and provide an output which is multiplied with the electrical signals for updating the parameters of the adaptive filter means.

BRIEF DESCRIPTION OF THE DRAWINGS

FIG. 2 is a block diagram of a prior art adaptive filter noise cancellation system.

FIG. 3 is a block diagram of the system of the present invention.

FIG. 4A being a standard type and FIG. 4B an adjoint type in accordance with the present invention.

FIG. 5A illustrates the prior art and FIG. 5B the present invention.

DETAILED DESCRIPTION OF THE PREFERRED EMBODIMENTS

Figure 1:
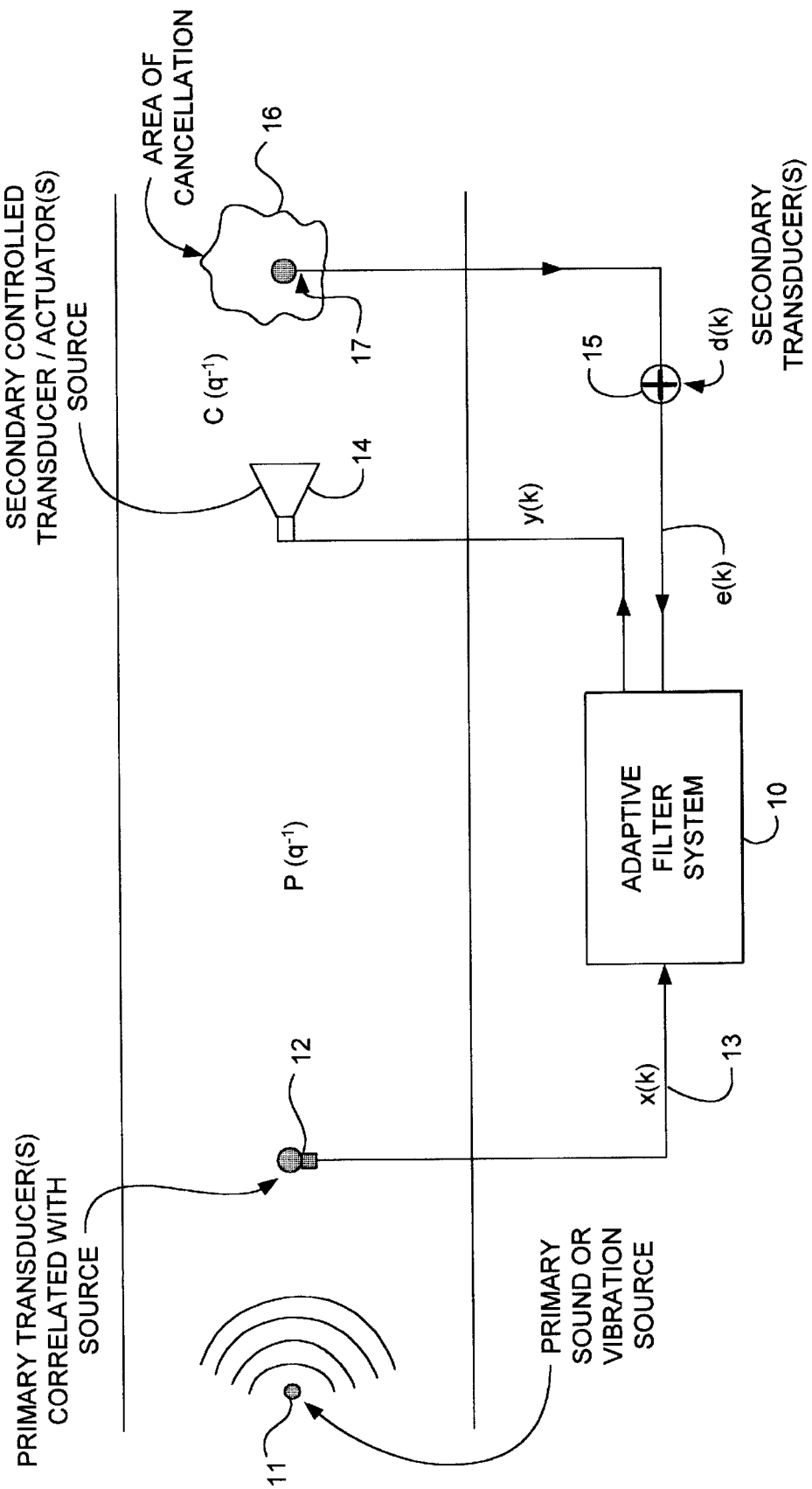
FIG. 1 is a block diagram of a sound and vibration cancellation system embodying the present invention.

FIG. 1 illustrates the basic set up for active noise cancellation for the filtered-x LMS algorithm including an adaptive filter system 10 which may either incorporate the prior art type of system or that of the present invention. In general the prior art system is fully described in the above-mentioned Elliot and Nelson article (see page 21). Although the system is shown as an acoustic or sound cancellation system it is also applicable to vibration cancellation. The primary sound or vibration source or sources is picked up by primary transducers 12. In the case of sound, these would be one or more microphones and in the case of vibration, transducers which convert the vibration to electrical signals. These electrical signals are designated on line 13 as a function x(k). This is fed to the adaptive filter system 10 whose output y(k) drives secondary control transducers/actuators 14. In the case of sound, this is a speaker and in the case of vibration, such transducers or actuators might include piezoelectric ceramics and magnetostrictive actuators.

The sound output of speaker 14 propagates down a secondary channel designated C toward an area of cancellation 16 which is picked up by a secondary transducer or microphone 17. The output of this microphone (which ideally is 0 or some predetermined suitable amount) is compared by a plus unit 18 to a set point d(k) and the resulting error function e(k) is fed back to the adaptive filter system 10. Microphone or transducer 12 is the primary pick up for the noise source and would be located near such source 11. Noise from source 11 propagates both through a primary channel P and the secondary channel C before being picked up by transducer or microphone 17. Loudspeaker 14 provides, by means of the adaptive filter system 10, destructive interference for canceling sound or vibration.

Referring now to the adaptive filter system 10, in general an adaptive filter system is specified as set out in equation (1). See the equations below. In equation (1)k is the time index, y is the filter output, x is the filter input, and w is the filter coefficients. This equation is more aptly described in the above references. The adaptive filter system 10 in the prior art is more fully illustrated in FIG. 2. This may be termed the Filtered-x LMS type.

The standard filtered x-LMS is illustrated in FIG. 2 where there exists a physical channel represented by $C(q^{-1}, k)$ between the output of the filter and the available desired response. $q^{-1}$ is a unit delay operator; i.e., $q^{-i} X_k = x(k-i)$. The output error is defined in Equation 2 and the filtered X-LMS algorithm expressed as Equation 3 and Equation 4 where $\hat{x}$ corresponds to the inputs filtered through a model $\hat{C}$ of the physical channel ($\mu$ controls the learning rate). This algorithm can be derived from the standard LMS algorithm assuming linearity by simply commuting the order of the filter and the channel. Thus the original x input become filtered by the channel (channel model) before entering the filter and the error appears directly at the outpout of the adaptive filter. Properties of this algorithm are discussed in Widrow and Stearns, *Adaptive Signal Processing*. Prentice Hall, 1985.

FIG. 2 corresponds to the prior art adaptive filter system 10 with the same designated inputs and outputs. The specific input 13 that is x(k), drives the adaptive filter 21. Such adaptive filter 21 is specified in equation 1 whose output y(k) drives the transducer 14 and is propagated to the secondary channel $C(q^{-1})$ of the physical environment illustrated in block 22. This is of course an actual physical channel which is dependent upon sound absorption, reflection etc,; and in the case of vibration, on the type of material and dimensions etc. Then block 23 is a theoretical model of this channel which through a multiplier 24 combined with the error function e(k) drives adaptive filter 21. Equations 2, 3 and 4 show the operation of this filtered-x LMS algorithm. Generally as illustrated it is for a single input/single output (SISO) system.

FIG. 3 illustrates the adjoint LMS of the present invention where the error e(k) (rather than the input) is filtered through the filter 23'(that is the adjoint of the modelled secondary channel C). And then its output through a multiplier 24' drives the adaptive filter 21. Adjoint filter 23' thus provides, when multiplied with the primary source input 13, electrical signals for updating the parameters of the adaptive filter 21. Since filter 23' is an adjoint representation of the channel C, the system is by definition non-causal.

Figure 4A:
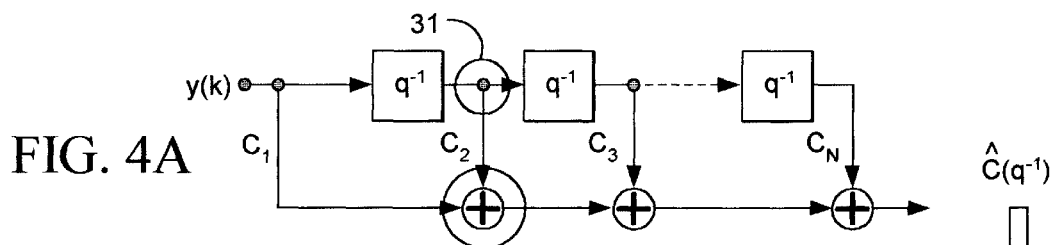
FIGS. 4A and 4B illustrate a finite impulse response filter.
Figure 4B:
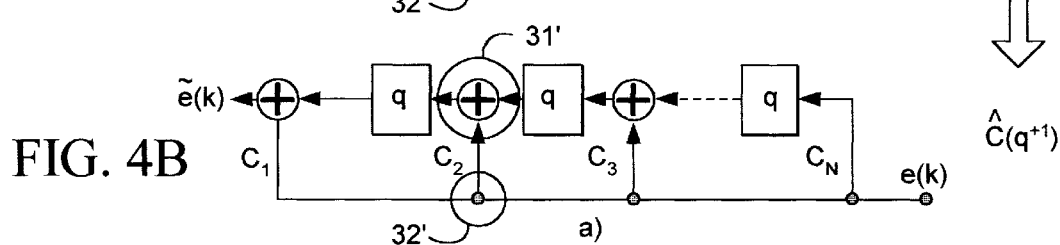
Figure 4C:
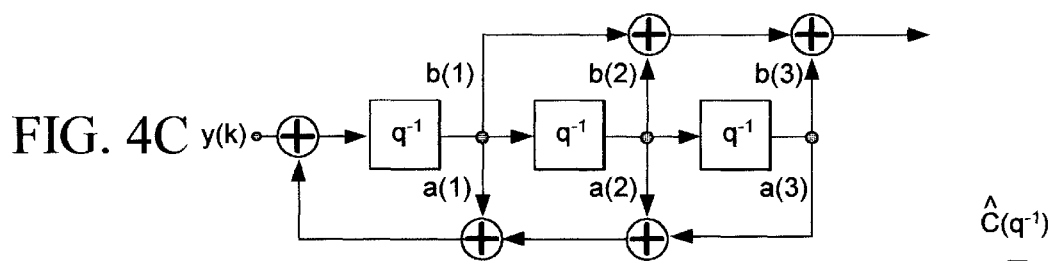
FIGS. 4C and 4D are schematics of a filter with FIG. 4C being an infinite impulse response filter of a standard type and FIG. 4D an adjoint type.

The equations illustrating FIG. 3 are Equations 5 and 6. These equations differ from Equations 3 and 4 in that the error rather than the input is now filtered by the channel model as illustrated in FIG. 2 (M2 is the order of the FIR-fast impulse response-channel model). Furthermore, the filtering is through the adjoint channel model ($q^{-1}$ is replaced by $q^{+1}$) Graphically, an adjoint system is found for any filter realization by reversing the flow direction and swapping branching points with summing junctions and unit delays with unit advances. This is illustrated in FIGS. 4A and 4B for an FIR tapped delay line. However, the method applies to all filter realizations including IIR (infinite impulse response) and lattice structures. The consequence of the noncausal adjoint filter is that a delay (equal to the channel model delay) must be incorporated into the weight update in Equation 5 to implement an on-line adaptation (to provide an effective causal realization).

Figure 4D:
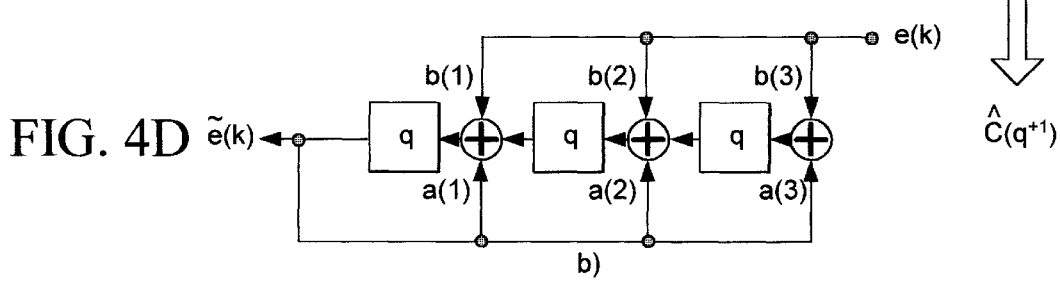
Figure 4E:
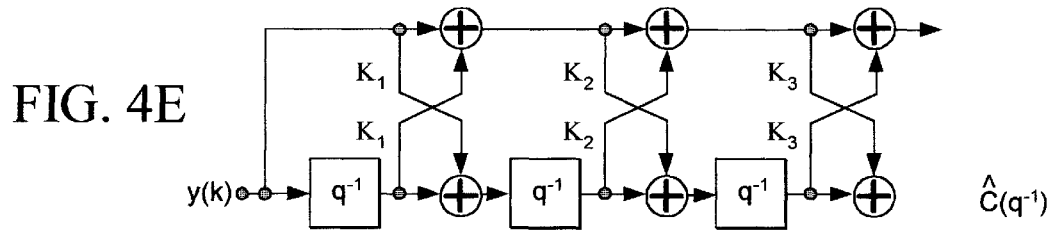
FIGS. 4E and 4F illustrate a filter of the finite impulse response lattice type with FIG. 4E being the standard type and FIG. 4E being an adjoint filter.
Figure 4F:
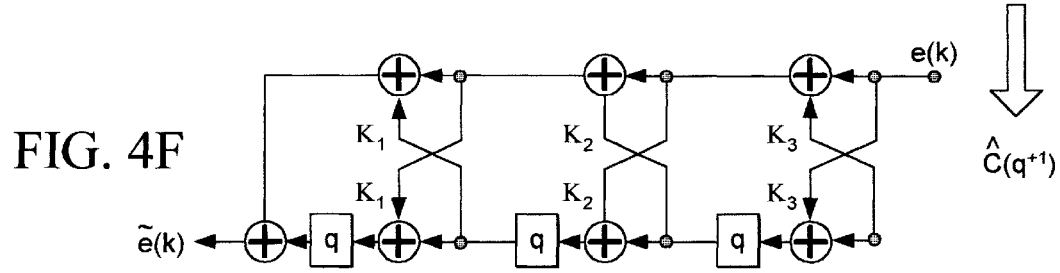

More specifically the standard filter of FIG. 4A, for example, has a branching point 31 which is circled and a summing junction 32. In the adjoint type device, the circled portion 31' is now a summing junction and 32' a branching point. The channel model filter illustrated in FIG. 4B is of the finite impulse response (FIR) type which is believed to be the most practical type of filter for this application. Other filters include an infinite impulse response (IIR) filter (see FIG. 4D). Finally FIG. 4F illustrates an FIR lattice (with FIG. 4E being the standard non-adjoint filter).

Adjoint LMS is clearly a simple modification of filtered-x LMS. For SISO systems the computational complexity of adjoint LMS and filtered x-LMS are identical. The real advantage comes when dealing with MIMO systems. In this case the adaptive filters are represented by an L×P matrix of transfer functions $W(q^{-1}, k)$ and the channel by a P×Q transfer function matrix $C(q^{-1}, k)$. Here L is the number of primary transducers, P is the number of controlled transducers/actuators, and Q is the number of secondary transducers.

FIG. 3 also represents this matrix configuration. Filtered x-LMS does not generalize directly since matrices do not commute and it makes no sense to filter the input X by C since dimensions may not even match. The Multiple Error LMS algorithm, proposed by Elliott et. al. solves this by effectively applying filtered x-LMS to all possible SISO paths in the MIMO systems, and can be written as Equation (7) for 1<l<L and 1<p<P, and there is now a filtered matrix of inputs for each filter $w_{lp}$ formed as Equation (8) with each row in the matrix found by filtering the input through the corresponding secondary path: Equation 9. The implementation of Multiple Error LMS results in a total of L×P×Q filter operations. In the cases of adjoint LMS, however, we encounter no such problem. Equations generalize directly: Equation (10). Here we note that the output error $\tilde{e}$ is dimension Q (number of channel outputs) whereas the error $\tilde{e}$ after filtering through the adjoint MIMO channel model is order P (number of primary filter outputs) as desired. The clear advantage of this form is that operations remain order N, where N is the total number of filter parameters (compare the weight update matrix operation in Equation (7) to the vector operation in Equation (10). Table 1 gives a comparison of multiplications for some specific parameter values.

TABLE I

| Multiplications | Adjoint LMS |
| --- | --- |
| δ(k) | P × Q × M2 = 102 |
| weight updates | L × P × M1 × 2 = 384 |
| total | 567 |
| Multiplications | Multiple Error LMS |
| filtered inputs | L × P × Q × M2 = 1,536 |
| weight updates | L × P × M1 × (Q + 1) = 1,728 |
| total | 3,264 |

Figure 6:
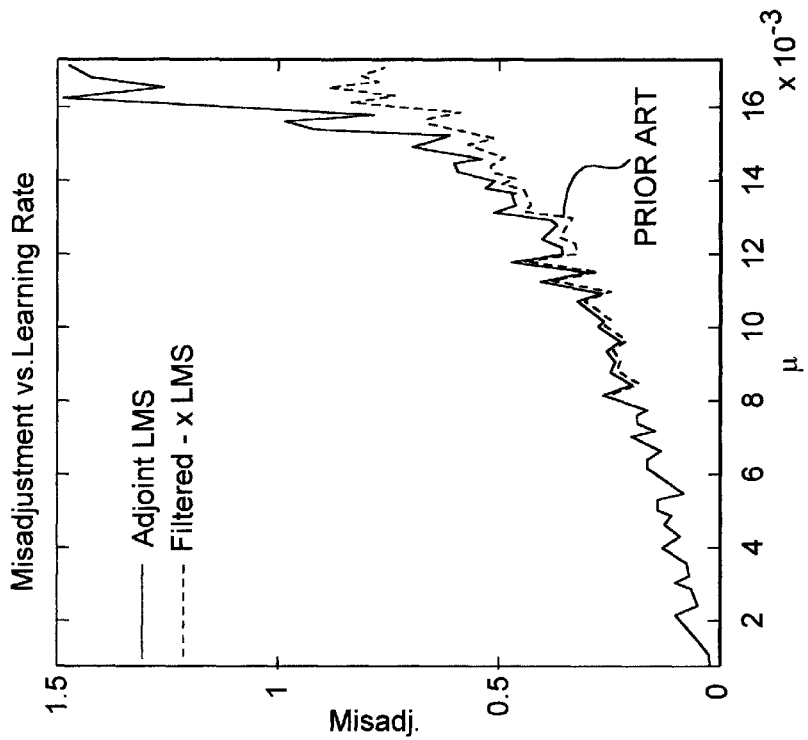
FIG. 6 is a curve which is a comparison of misadjustment versus a learning parameter.
Figure 5A:
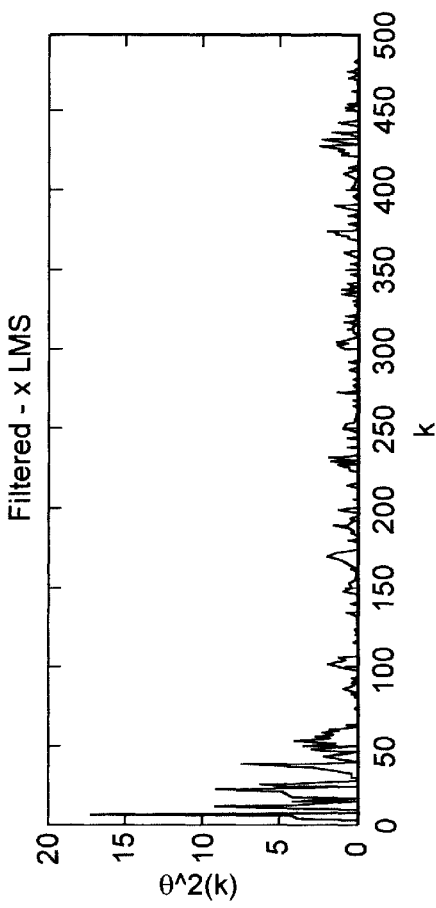
FIGS. 5A and 5B are learning curves of a LMS type system where
Figure 5B:
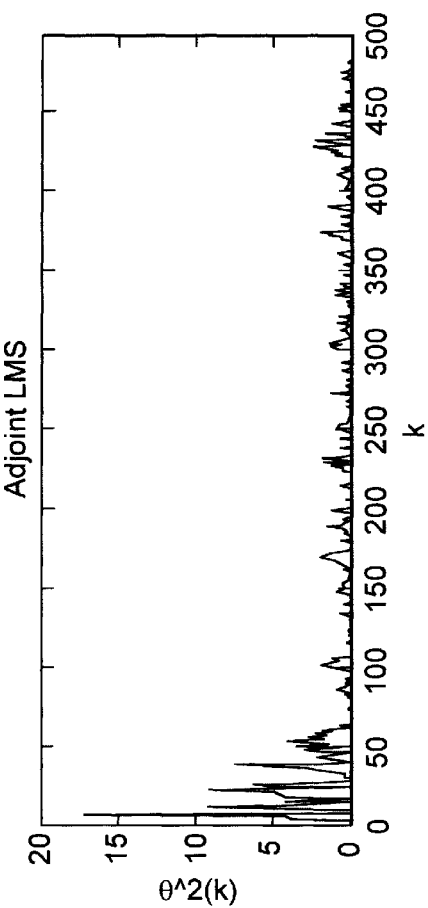
Figure 8:
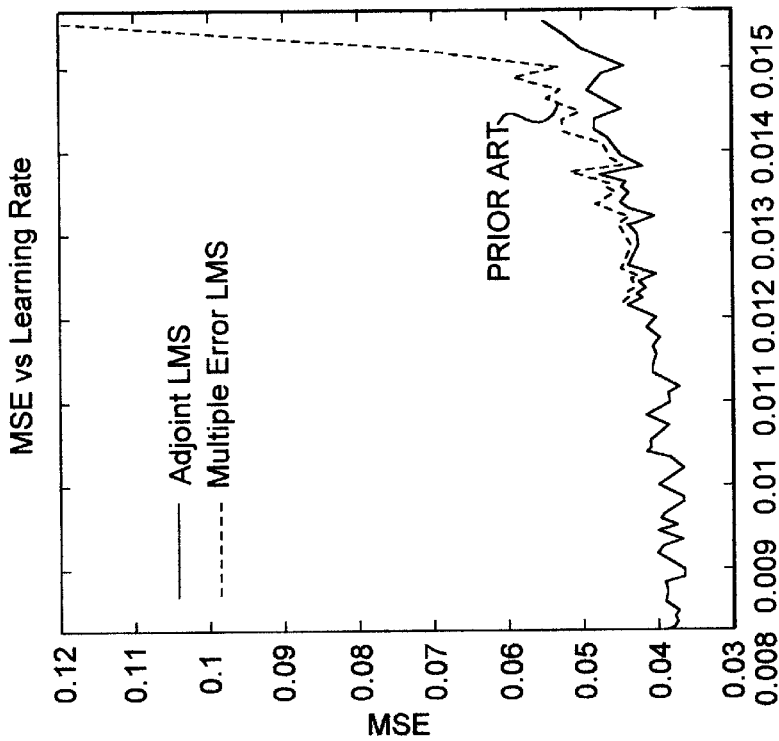
FIG. 8 are curves which are a comparison of the learning rate for the prior art and the present invention for multiple-input/output-systems.
Figure 7A:
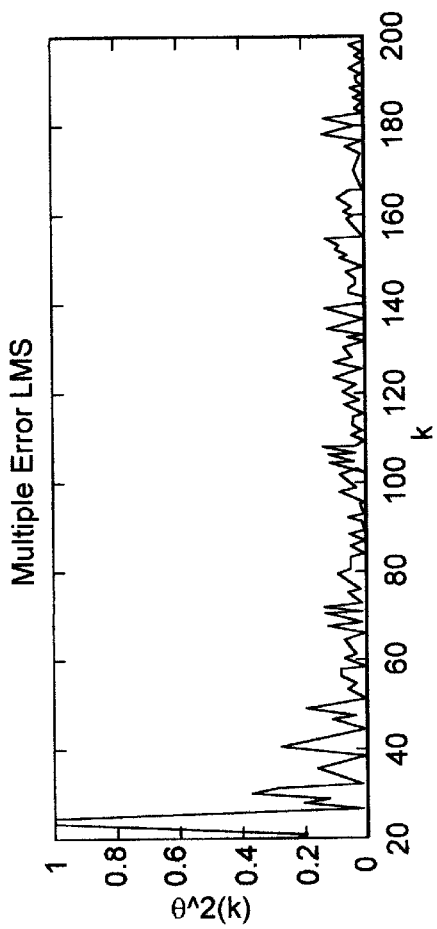
FIGS. 7A, 7B are curves similar to FIGS. 5A and 5B of LMS learning curves with FIG. 7A being for a multiple type LMS system of the prior art and FIG. 7B being the system of the present invention.
Figure 7B:
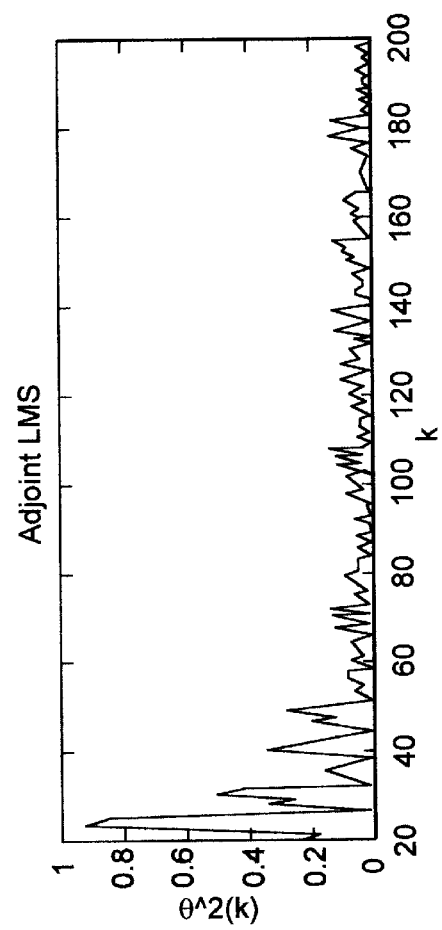

Thus in summary when the filtered-x LMS is typically modified as suggested by Elliot et al there are multiple computational paths for every permutation which must be repeated resulting in significant computational complexity. With the present invention as discussed, this is eliminated with the computational complexity as discussed above, remaining order N. FIGS. 5A and 5B show learning curves in the first case for the standard filtered-x LMS in FIG. 5A and then for the adjoint LMS of the present invention in FIG. 5B which is for a single-input-single-output type system (SISO). They are substantially similar. Due to the delayed wait update a slight increase in misadjustment for large learning parameters is illustrated in FIG. 6. For a multiple-input-multiple-output (MIMO) system FIGS. 7A and 7B offer a comparison where there are similar performances regarding squared learning curves for the adjoint system and the multiple error LMS as described by Elliot et al. And FIG. 8 illustrates how the learning rate for the adjoint LMS is superior to the prior art.

Thus an efficient alternative to filtered-x LMS and multiple error LMS algorithm has been provided which is especially useful for active noise control.

$$y(k) = \sum_{n=0}^{MI} w_n(k)x(k-n) = w^T(k)x(k) \quad (1)$$

$$e(k)=d(k)-C(q^{-1},k)y(k) \quad (2)$$

$$w(k+1)=w(k)+\mu e(k)\tilde{x}(k) \quad (3)$$

$$\tilde{x}(k)=\hat{C}(q^{-1},k)x(k) \quad (4)$$

$$w(k+1)=w(k)+\mu e(k-M2)x(k-M2) \quad (5)$$

$$\tilde{e}(k)=\hat{C}(q^{+1},k)e(k) \quad (6)$$

$$w_{lp}(k+1)=w_{lp}(k)+\mu e^T(k)\tilde{X}_{lp}(k) \quad (7)$$

$$\tilde{X}_{lp}^T(k)=[\tilde{X}_{lp1}(k)\tilde{x}_{lp2}(k)\ldots\tilde{x}_{lpQ}(k)] \quad (8)$$

$$\tilde{x}_{lpq}(k)=C_{pq}(q^{-1},k)x_l(k). \quad (9)$$

$$w_{lp}(k+1)=w_{lp}(k)+\mu\tilde{e}_p(k-M2)x_l(k-M2)$$

$$\tilde{e}(k)=\hat{C}(q^{+1},k)e(k), \quad (10)$$

What is claimed is:

1. A multiple input/output system for active sound/vibration cancellation in a desired area of a physical environment having one or more sources of sound and/or vibration comprising:

primary transducer means for picking up said sound and/or vibration and converting to electrical signals representative of said sources;

controlled transducer/actuator means located in said physical environment near said area of cancellation for providing said cancellation by destructive interference with said one or more sources;

secondary transducer means located in said area of cancellation for picking up via a secondary physical channel both said sources of sound and/or vibration and said destructive interference, said secondary physical channel having parameters determined by said physical environment;

said secondary transducer means including set point means related to said cancellation to provide an error signal;

adaptive filter means driven by said electrical signals representative of said sources for driving said controlled transducer/actuator means;

adjoint filter means modeled after said secondary physical channel for receiving said error signals and providing an output which is multiplied with said electrical signals for updating the parameters of said adaptive filter means, whereby computational complexity is simplified.

2. A multiple input/output system for active sound/vibration cancellation as in claim 1 where said adjoint filter means is realized by reversing flow direction of standard filters including infinite impulse response or finite impulse response filters, swapping branching points with summing junctions and unit delays with unit advances.

3. A multiple input/output system for active sound/vibration cancellation as in claim 1 where said one or more primary sources include sources correlated with said sound and vibration sources.

4. A multiple input/output system for active sound/vibration cancellation as in claim 1 where said adjoint filter means is non-causal and includes delay means equal to said secondary channel delay to provide an effective causal implementation.

* * * * *